United States Patent

Schaaf

[11] Patent Number: 4,507,330
[45] Date of Patent: Mar. 26, 1985

[54] PLATING METHOD USING EXPANDABLE MASKING BED

[75] Inventor: Theodore F. Schaaf, Mercer County, N.J.

[73] Assignee: AT&T Technologies, Inc., New York, N.Y.

[21] Appl. No.: 525,339

[22] Filed: Aug. 22, 1983

[51] Int. Cl.³ .......................... B05D 1/32; B05D 5/00
[52] U.S. Cl. ...................... 427/261; 211/41; 427/98; 427/282
[58] Field of Search .............. 427/282, 300, 98, 261; 118/504, 505, 406; 211/41, 42; 83/651.1; 204/297 R, 297 W

[56] References Cited

U.S. PATENT DOCUMENTS 3,257,308  6/1966  Cottom ............................. 204/297
3,901,110  8/1975  Priestly ........................... 83/651.1

FOREIGN PATENT DOCUMENTS 2504681  8/1976  Fed. Rep. of Germany ........ 211/41
2159191  6/1973  France ............................ 204/297 W Primary Examiner—Evan K. Lawrence
Attorney, Agent, or Firm—Joel F. Spivak

[57] ABSTRACT

A process of reacting a selective area of an article with a heated liquid, such as by immersion in a heated electroless plating bath, utilizes a holder which is particularly suitable for use in retaining a plurality of printed circuit boards to be immersed in an electroless plating bath. The holder comprises a rigid base and a heat expandable foam bed mounted to the base, the foam bed having slits therein into which the printed circuit board is placed and held. Upon immersion of the article, the foam bed thermally expands to mask the article from the bath in the areas covered by the bed.

9 Claims, 1 Drawing Figure

PLATING METHOD USING EXPANDABLE MASKING BED

TECHNICAL FIELD

This invention relates to a method of treating a selective portion of an article in a heated active liquid bath using an article holding device which acts to mask a portion of the article when immersed in the bath.

BACKGROUND OF THE INVENTION

When an article is to be processed by immersion in a heated liquid reactant bath, means for holding the article are generally employed. In many instances, such as in the manufacture of printed wiring boards wherein the process includes the step of immersing the boards in a heated plating solution, it is often also necessary to mask a portion of the board so as to prevent reaction (plating) in certain specified areas. For example, for registration purposes, locating holes are often present along the lower edge of a typical printed circuit board. These holes must be plugged or masked to prevent the deposition of copper in the holes. In accordance with prior art techniques, these holes are plugged with a rubber plug which must be placed in each hole and then removed subsequent to the plating operation. This is a relatively timely and generally labor intensive procedure which thereby adds to the cost of the product. In addition the device utilized to hold the PC board during plating is clamped on, leading to further labor and time costs.

It would be desirable to employ a means of holding the articles which would automatically mask predetermined areas from the action of the reactant bath. It is also desirable to employ a holding means which does not require clamping and wherein loading of the articles therein is simple such that upon loading, masking and clamping is automatic.

SUMMARY OF THE INVENTION

A method of treating a selective portion of an article in a heated active liquid bath uses an article holder and liquid reactant masking device comprising a heat expandable bed on a rigid base. The bed comprises a material which expands due to the heat of a heated liquid upon immersion into the liquid, said bed having a plurality of article accepting slits therein, the slits being of such a width that allows the article to be easily set in place in the holder prior to immersion but which thermally expands so as to securely hold or clamp the article upon immersion into the heated liquid reactant while simultaneously effectively masking that portion of the article from action by the reactant in the areas covered by the foam bed.

BRIEF DESCRIPTION OF THE DRAWING

The FIGURE is an elevational view of an embodiment of the invention.

DETAILED DESCRIPTION

Figure 1:
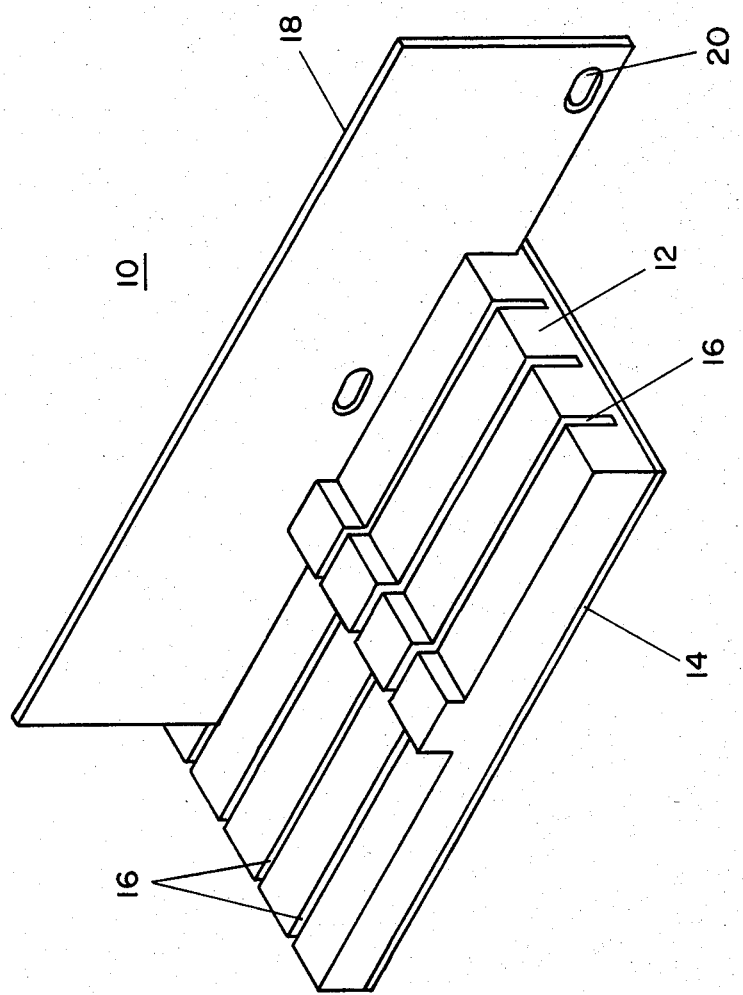

Referring to the FIGURE, there is shown an article holding and masking device 10 used in the process of the present invention. The device 10 as shown, comprises an expandable bed 12 mounted on a rigid support 14. The expandable bed 12 has a plurality of spaced parallel slits 16 within which one or more articles, e.g., a printed circuit board 18, can be held. The printed circuit board 18 has a plurality of registration holes 20 above its lower edge. These holes are to be masked from the action of the electroless plating solution so that no plating occurs therein.

The expandable bed 12 must be made of a material which expands due to heat when immersed in a fluid. It should also be non-reactive with the fluid, therefore the particular bed material may depend upon the nature of the fluid into which it is immersed. Generally, suitable materials include resilient heat expandable polymeric foams, e.g., polyethylene or polypropylene foams, polyurethane foam and rubber foams. For use as a printed circuit board holder for immersion in an electroless plating bath, polyethylene foam is preferred.

The rigid support may be any rigid material onto which the expandable bed may be bonded or otherwise mounted and should also be inert to the fluid into which the article is to be immersed. Typical substrates include metals, composites, plastics, glass and ceramics. Metallic substrates are not preferred for use in electroless plating baths due to the tendency to plate thereon. In such instances a composite epoxy-glass substrate, irradiated polyvinyl chloride or a ceramic such as alumina is preferred. Suitable adhesives for bonding the expandable bed to the support are well known in the art. One such adhesive that is generally suitable is an epoxy type adhesive. Alternatively, one can screw, bolt or otherwise fasten or mount the bed on the support. For example, the support can be formed with sides of which clamp the bed in place.

The slits 16 into which the articles to be held and masked, may be formed by means of a razor cut or utilizing a hot wire. The width of the slit depends upon the width of the article to be placed therein. One generally seeks a width which makes loading the articles in the holder relatively easy prior to immersion but where expansion after immersion in the fluid not only causes the article to be held securely but also masks the article from the action of the reactive liquid into which it is placed. The depth of the slit or height of the bed at any point determines the portion of the article to be masked. Masking effectively takes place due to the expandable bed pressing against and covering those areas of the article to be masked. It should be noted, as shown in the figure, that the height of the bed above the base of the slit may vary so as to mask essentially any desired contour, design or shape. In making the slit, one should be aware of the tendency of the slit to expand somewhat after the initial use. Therefore, the first time the holder is used it may be somewhat more difficult to load the article into the holder than in subsequent operations.

Typically, when employing the holder for securing and masking 60 to 90 mils thick printed circuit boards, the slit may vary from several mils (razor cut) to about 100 mils. Preferably, the slit is cut with a hot wire of about 20 mils thick. This latter slit opens to about 60 mils after the first use with a 60 mil printed circuit board.

It should be noted that the means for holding an article need not be in the form of parallel straight slits. For example, one can form circular slits for holding articles having a circular base, sinusoidal slits for holding a corrugated shaped article and the like.

The use of the novel device allows for a plurality of circuit boards (or other articles) to be quickly and easily placed in a holder which upon immersion into a heated processing solution automatically firmly clamps and masks the circuit boards or other article thereby eliminating the labor intensive steps of clamping and masking as present in the prior art.

EXAMPLE I

A two inch high polyethylene foam material having a density of about 4 lbs. per ft.$^3$ was bonded with epoxy to a rigid epoxy-glass substrate. A plurality of spaced parallel slits for holding an equal number of circuit boards was formed in the polyethylene foam. The slits were formed utilizing a 20 mil hot wire and were spaced about 1 inch apart. The depth of the slit was about 1¾ inches. (One can cut the slit down to the base if desired.) Printed circuit boards to be selectively plated in an electroless plating bath were prepared for plating by the ordinary surface preparation, cleaning, rinsing and sensitizing steps which are well known in the art. These boards were then placed in the slits of the holder. Upon first use, there was some difficulty in loading the last of the circuit boards in the slits. However, thereafter, loading was easy and once loaded the boards would not tend to fall out. Upon immersion of sensitized boards in an electroless plating bath, at 60° C., no plating was observed in the locating holes masked by the foam bed.

EXAMPLE II

An experiment was performed utilizing a device made as described above but with a 45 mil slit to qualitatively determine the expansion, and hence, the holding and masking ability of the device. A 60 mil board was placed in a holder slit. The board entered easily but would not fall out. It was then placed in a room temperature bath where it was observed that the board could be easily moved in the slit but would not fall out without external force being applied. Essentially, the same effect was observed with the bath raised to 35° C. At 40° C. the board was held more snugly in the device, until after about 50° C., the board was held tightly due to expansion of the foam bed material, effectively masking the areas of the board covered by the foam bed. In order to check the reversability of the process the bath temperature was reduced from 60° C. to 45° C. and then raised again to 60° C. It was observed that the board was held less snugly at 45° C. and tightened again when the bath returned to 60° C.

It should be understood that while the invention is described with reference to printed circuit boards, it is suitable to hold and/or mask essentially any article, especially flat articles, which are to be subjected to processing in fluids at raised temperatures.

What is claimed is:

1. A method of plating a selective portion of an article in a heated plating bath comprises:

preparing the article for immersion into the plating bath;

placing the article into a holder therefor, said holder comprising a rigid base, a heat expandable resilient bed having a plurality of spaced article retaining slits therein mounted to said base, said slits being of such shape and width as to firmly retain the article and mask the portions of the article from reaction by the heated plating bath due to thermal expansion of the bed material upon immersion into the plating bath;

immersing the article and holder into the heated plating bath for a length of time sufficient to allow the desired plating to take place in areas not masked by the heat expandable bed.

2. The method of claim 1, wherein the heat expandable resilient bed is formed from a polymer foam.

3. The method of claim 2, wherein the polymer foam is a polyethylene foam.

4. The method of claim 1, wherein the slits in the heat expandable bed are spaced, parallel slits capable of accepting an article in the form of a flat board.

5. The method of claim 4, wherein the bed is comprised of a polymer foam.

6. The method of claim 5, wherein the polymer foam is a polyethylene foam.

7. The method of claim 4, wherein the slits are formed by cutting the bed with a hot wire.

8. The method of claim 4, wherein the slits are 20 mil slits capable of accepting and holding a 60 and 90 mil board.

9. The method of claim 1, wherein the height of the bed is non-uniform.

* * * * *